United States Patent [19]

Oguri

[11] 4,054,844

[45] Oct. 18, 1977

[54] AMPLIFYING SYSTEM

[75] Inventor: Kenro Oguri, Hamamatsu, Japan

[73] Assignee: Nippon Gakki Seizo Kabushiki Kaisha, Hamamatsu, Japan

[21] Appl. No.: 676,661

[22] Filed: Apr. 13, 1976

[30] Foreign Application Priority Data

Apr. 15, 1975 Japan .............................. 50-51077[U]
June 12, 1975 Japan .............................. 50-80230[U]

[51] Int. Cl.$^2$ ........................ H03F 1/00; H01C 10/16
[52] U.S. Cl. ................................ 330/155; 330/278; 330/129; 338/139
[58] Field of Search .................... 330/29, 129, 155; 338/122, 139, 174

[56] References Cited

U.S. PATENT DOCUMENTS

| | | | |
|---|---|---|---|
| 1,673,792 | 6/1928 | Affel | 330/129 X |
| 2,492,542 | 12/1949 | Stone | 330/155 X |
| 3,296,546 | 1/1967 | Schneider, Jr. | 330/155 X |

Primary Examiner—Lawrence J. Dahl
Attorney, Agent, or Firm—Cushman, Darby & Cushman

[57] ABSTRACT

An amplifying system comprises an amplifier having a certain constant gain, a first variable attenuator through which an input signal for this system is inputted to the amplifier, and a second variable attenuator through which the output signal of the amplifier is delivered. The over-all gain of the system is variable from the minimum gain to the maximum gain by gang-operating the two variable attenuators. The two variable attenuators are of such a construction that the attenuation factor of the first attenuator is substantially variable in the operation range near the middle of the variable gain whereas that of the second attenuator is substantially variable in the operation ranges near the minimum and maximum of the variable gain. When the input signal level is low, the second attenuator functions in the near-maximum range, and when high, the first attenuator functions in the middle range, thus delivering an output signal at the rated level. To decrease the output level further, the second attenuator functions in the near-minimum range. The S/N ratio of the output signal is good for various input signal level.

8 Claims, 7 Drawing Figures

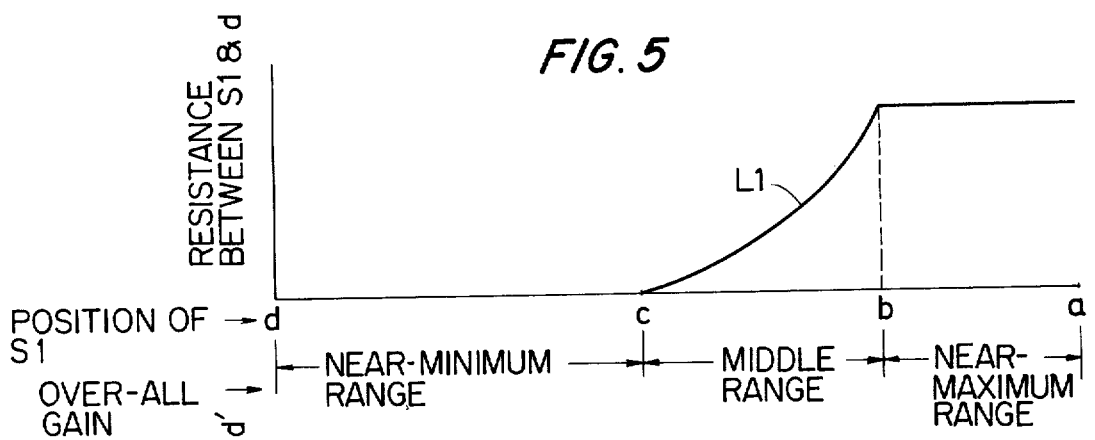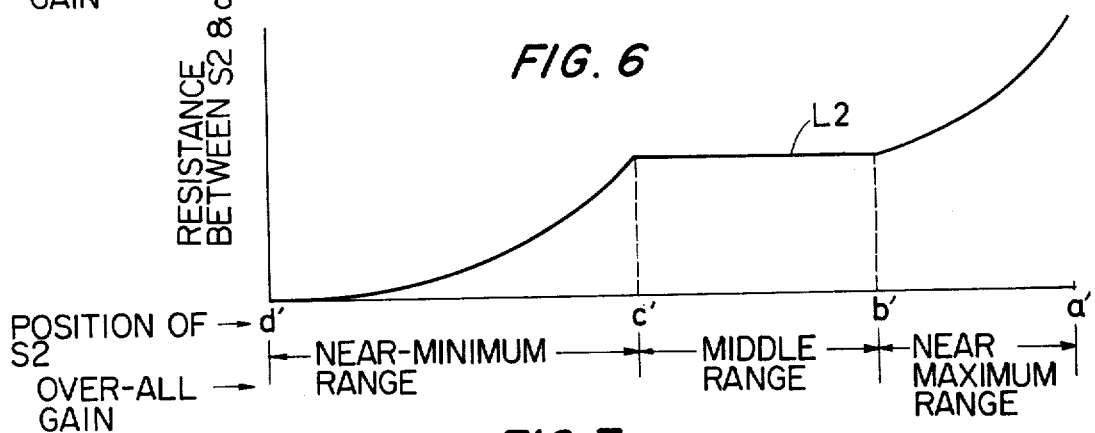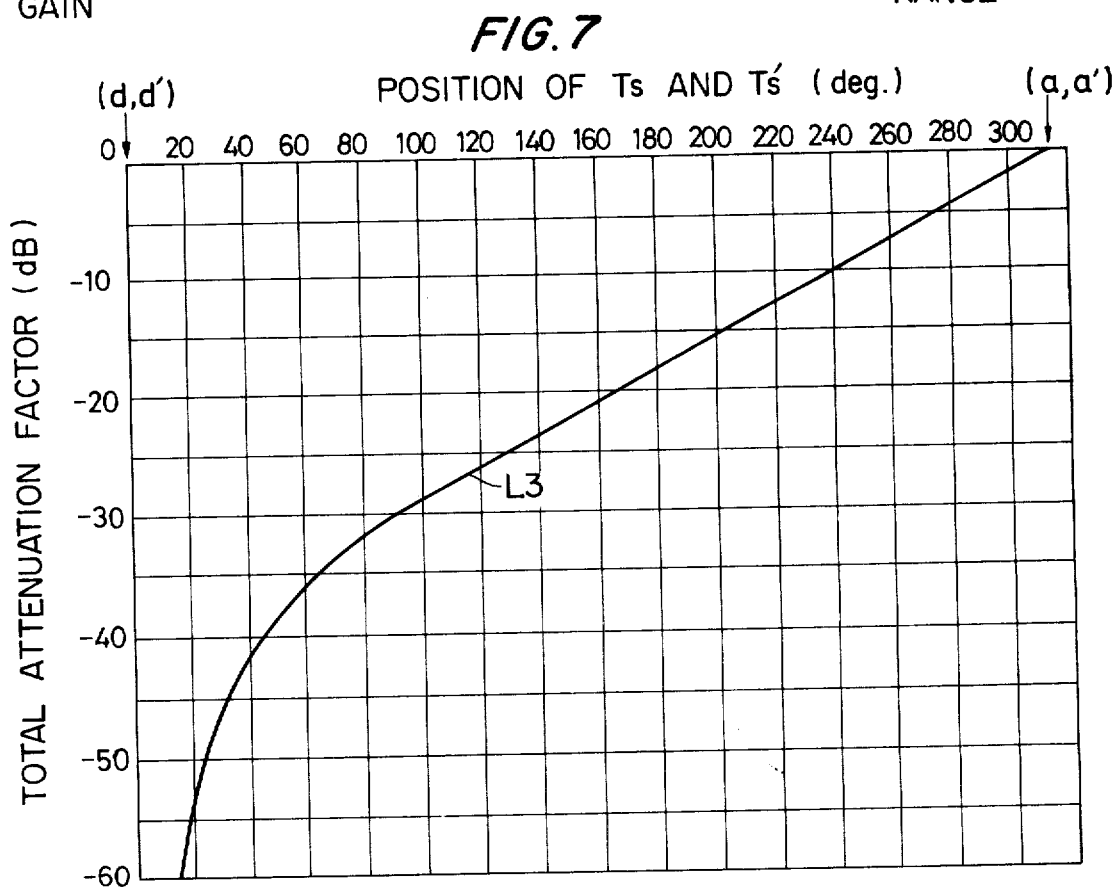

AMPLIFYING SYSTEM

BACKGROUND OF THE INVENTION a. Field of the Invention

The present invention relates to an amplifying system, and more particularly it pertains to an amplifying system whose over-all gain is adjustable to obtain an output signal of the rated level at a good S/N ratio without any distortion caused by the saturation of the amplifier employed therein and noise generated in this amplifier, irrespective of the level of the inputted signal.

b. Brief Description of the Prior Art

An amplifying system for amplifying an electrical signal is often required to be adjustable of its over-all gain to obtain an output having a certain desired level (i.e. rated output level) irrespective of the level of the signal inputted thereto. In this specification, the term "level" means the magnitude standard of the signal and not the instantaneously varying magnitude of the signal. For instance, a pre-amplifier employed in a stereo set is assigned to amplify signals of various levels fed from such signal sources as a disk record player, a tape recorder, an FM-receiver, and so on. In other words, the pre-amplifier is used to amplify such input signal of different levels up to one having a particular level when derived at the output terminal, irrespective of the input-signal level, i.e. irrespective of the type of the signal source connected to the pre-amplifier. Thus, the pre-amplifier is designed to carry out an adjustment of its over-all gain.

To accomplish an over-all gain-adjustment of an amplifying system, therefore, there have been proposed and placed on the market an amplifying system arrangement as shown in FIGS. 1 and 2.

The known amplifying system shown in FIG. 1 is composed of an amplifier A having a certain gain and a potentiometer VR provided at the input side of the amplifier A for adjusting the level of the signal inputted to the amplifier A to adjust the over-all gain of this amplifying system. Needless to say, the over-all gain of this amplifying system can be adjusted, by operating the slider tap of the potentiometer VR, so that there can be obtained an output signal of a desired level at the output terminal OUT, irrespective of the level of the input signal fed to the input terminal IN. For instance, when a signal of a high level is inputted to this amplifying system at its input IN, the slider tap of the potentiometer VR is operated to move downwardly as viewed in FIG. 1 to decrease the over-all gain of the amplifying system.

However, the decreasing operation of the over-all gain of this amplifying system by the operation of the potentiometer VR quite often results in a worsening of the S/N ratio (signal to noise ratio) of the amplifying system for the following reasons. The S/N ratio represents the ratio of the level of the input signal component contained in the output signal of the system to that of the noise component contained in the output signal. The level of the input signal component is proportional to the level of the signal inputted to the amplifier A, while the level of the noise component is dependent mainly upon the level of the noise generated within the amplifier A per se, i.e. the level of the internal noise peculiar to this amplifier A, and this noise level is substantially constant irrespective of and irrelevant to the level of the signal inputted to the amplifier A. Therefore, when the level of the signal inputted to the amplifier A is decreased to a lower level by the operation of the potentiometer VR, there is certainly obtained a lowered over-all gain of the amplifying system, but this is accompanied by an unwanted poor S/N ratio.

FIG. 2 shows the typical arrangement of another amplifying system of the prior art. As is seen in this figure, there is provided, at the output side of an amplifier A having a certain gain, a potentiometer VR intended for adjusting the level of the signal derived at the output terminal OUT which, in turn, is connected to the slider tap, of this potentimeter VR to perform an adjustment of the over-all gain of this amplifying system. By moving this slider tap of the potentiometer VR, it is possible to adjust the over-all gain so that there is delivered at the output terminal OUT an output signal of a desired level, irrespective of and irrelevant to the level of the signal inputted to the input terminal IN of the amplifying system, i.e. in this arrangement, to the input terminal of the amplifier A itself. For example, in the case wherein the input signal of a high level is applied to the input terminal IN, the slider tap of the potentiometer is operated to move downwardly as viewed in FIG. 2 in order to decrease the over-all gain of the whole amplifying system so that the output signal of a desired level is derived at the output terminal OUT. Thus, this known arrangement of FIG. 2 is capable of performing an adjustment of the over-all gain or an adjustment of the output level of the amplifying system.

It should be noted, however, that this conventional arrangement of FIG. 2 has the disadvantage that, in case the input signal of an excessively high level which exceeds the permissible maximum input-level set for its amplifier is inputted to the amplifying system, such a high-level input signal will develop a saturation phenomenon of the amplifier and, as a result, the output signal derived will be an unpleasantly distorted one.

As discussed above, these known amplifying systems are generally arranged to be operative so that the over-all gain is adjusted by a single potentiometer provided either at the input side or at the output side of an amplifier which is a member constituting such amplifying system in cooperation with the potentiometer. In other words, there is provided a single potentiometer as signal-level-variable attenuating means assigned for attenuating the level of the input or output signal of the amplifier to a desired level.

SUMMARY OF THE INVENTION

It is, therefore, a primary object of the present invention to provide an amplifying system whose over-all gain can be adjusted by a simple gain-adjusting operation to obtain, for input signals of various levels, an output signal of a desired level at a high S/N ratio without any distortion of the output signal resulting from the saturation of the amplifier in the system and noise generated in this amplifier.

Another object of the present invention is to provide an amplifying system of the type described, which is simple in arrangement.

According to the present invention, there is provided an amplifying system comprising: a first variable attenuating means for receiving an input signal for the amplifying system to thereby deliver out the level-attenuated input signal, an amplifier having a certain gain for amplifying the output signal of the first variable attenuating means; and a second variable attenuating means for receiving the output signal of the amplifier to deliver out the level-attenuated signal as an output signal of the amplifying system. The over-all gain of the amplifying system varies, for a certain gain-variable range set for the whole amplifying system, depending upon the total of the respective attenuation factors of these two variable attenuating means. The attenuation factors of these two variable attenuating means are simultaneously adjusted by a same single adjusting operation in such a way that the attenuation factor of the second variable attenuating means is substantially varied by this adjusting operation to change the over-all gain with respect to a higher gain portion and a lower gain portion of said gain-variable range and at the same time therewith the attenuation factor of the first variable attenuating means is varied by the same adjusting operation to change the over-all gain with respect to the middle portion of said gain-variable range.

Consequently, it is a further object of the present invention to provide such variable attenuating means as described above, which is simplified in construction.

These and other objects as well as the features of the present invention will become apparent by reading the following detailed description when taken in conjunction with the accompanying drawings.

BRIEF DESCRIPTION OF THE DRAWINGS

FIGS. 5 and 6 are charts showing the resistance-variation characteristics of the first and second potentiometers shown in FIG. 4.

FIG. 7 is a chart showing the variation characteristic of the total of the respective attenuation factors of both the first and second variable attenuating means shown in FIG. 4.

Like parts are indicated by like reference numerals and symbols throughout the drawings.

DETAILED DESCRIPTION OF THE PREFERRED EMBODIMENTS

Figure 1:
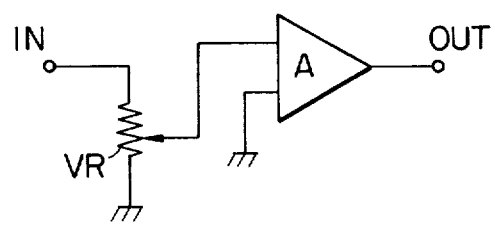
FIGS. 1 and 2 are block diagrams showing the typical arrangements of an amplifying system according to the prior art, respectively.
Figure 2:
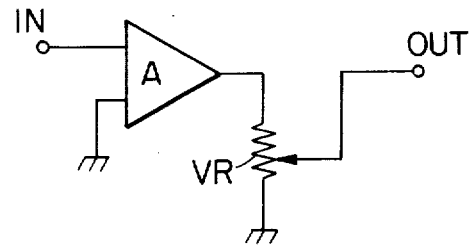
Figure 3:
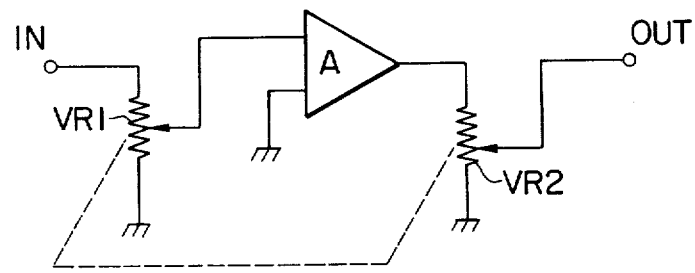
FIG. 3 is a block diagram showing the principle of the amplifying system according to the present invention.

With reference to FIG. 3, description will be made on the principle of the amplifying system according to the present invention.

The amplifying system according to the invention includes an amplifier A having a certain gain, and a first and a second variable attenuating means VR1 and VR2 provided at the input side and at the output side of the amplifier A, respectively. An input signal applied to the input terminal IN of the amplifying system is attenuated of its level through the first variable attenuating means VR1 and then is inputted to the amplifier A, thus being amplified by the amplifier A.

The output signal of the amplifier A is attenuated of its level by the second variable attenuating means VR2 to be delivered out, as the output signal of the whole amplifying system, to the output terminal OUT.

The over-all gain of the amplifying system varies for a certain gain-variable range which is set for the whole system, depending upon the total of the respective attenuation factors of both the first and second variable attenuating means VR1 and VR2. According to the present invention, the gain-variable range is divided into at least two sub-ranges. For instance, the gain-variable range includes a first sub-range (near-maximum range) covering from the maximum gain value of this range to a first gain value, and a second sub-range covering from the first gain value to a second gain value. If there are only two sub-ranges, then this second gain value is zero. Preferably, however, the second sub-range is a middle range, and the gain-variable range includes a third sub-range (near-minimum range) covering from the second gain value to zero.

The first and second variable attenuating means VR1 and VR2 are designed to be operative so that the attenuation factors of these means VR1 and VR2 are gang-varied by a same single adjusting operation in such a way that the attenuating factor of the second variable attenuatng means VR2 is varied by said same single adjusting operation to change the over-all gain with respect only to both the first and third sub-ranges of the gain-variable range, and at the same time, the attenuation factor of the first variable attenuating means VR1 is varied by this adjusting operation to change the over-all gain with respect only to the second sub-range of the gain-variable range i.e., the attenuation adjustments effected by VR1 and VR2 are mutually exclusive notwithstanding the fact that VR1 and VR2 are ganged.

The amplifying system arranged as above is used as follows. When an input signal of a low level is applied to the amplifying system, the over-all gain of this system is adjusted through the adjusting operation of the variable attenuating means VR1 and VR2 to be a certain high gain value within the first sub-range so that there can be obtained the amplified input signal of a desired level at the output terminal OUT. In this case, the variation of the over-all gain is accomplished by the second variable attenuating means VR2, because in this case the attenuation factor of the first variable attenuating means VR1 remains at a certain minimum value, for example zero, irrespective of the adjusting operation. Thus, the input signal is applied, after being attenuated of its level by a minimum amount through the first variable attenuating means VR1, to the amplifier A, with the result that the input signal can be amplified at a high S/N ratio.

When an input signal of a middle level is fed to the amplifying system, the over-all gain is adjusted through the adjusting operation of the variable attenuating means VR1 and VR2 to be a certain lower gain value within the second sub-range so that the output level of the amplifier becomes a desired level. In this case, only the first variable attenuating means VR1 effects the variation of the over-all gain, since the attenuation factor of the second variable attenuating means VR2 is not varied but remains at a certain value irrespective of the adjusting operation. If the first variable attenuating means VR1 is designed to provide such an attenuation factor for such input signal that the input signal is attenuated to a level which will not cause the amplifier A to be saturated, if inputted to it, then the input signal there can be amplified by this amplifying system without any distortion resulting from the saturation of the amplifier A.

In the case wherein an input signal to the amplifying system has a high level (allowable maximum input level) and the output signal of lower level is required, the over-all gain need to be further lowered so that the output level of this amplifying system is adjusted to a desired level. In this case, the attenuation factor of the first variable attenuating means VR1 no more increases to prevent the deterioration of the S/N ratio of the amplifying system, but that of the second variable attenuating means is varied according to the adjusting operation to change the over-all gain.

As such, there can be carried out the amplification of an input signal of any level from high to low levels by the amplifying system according to the present invention, at a high S/N ratio and without any distortion resulting from the saturation of the circuit of the amplifying system.

Figure 4:
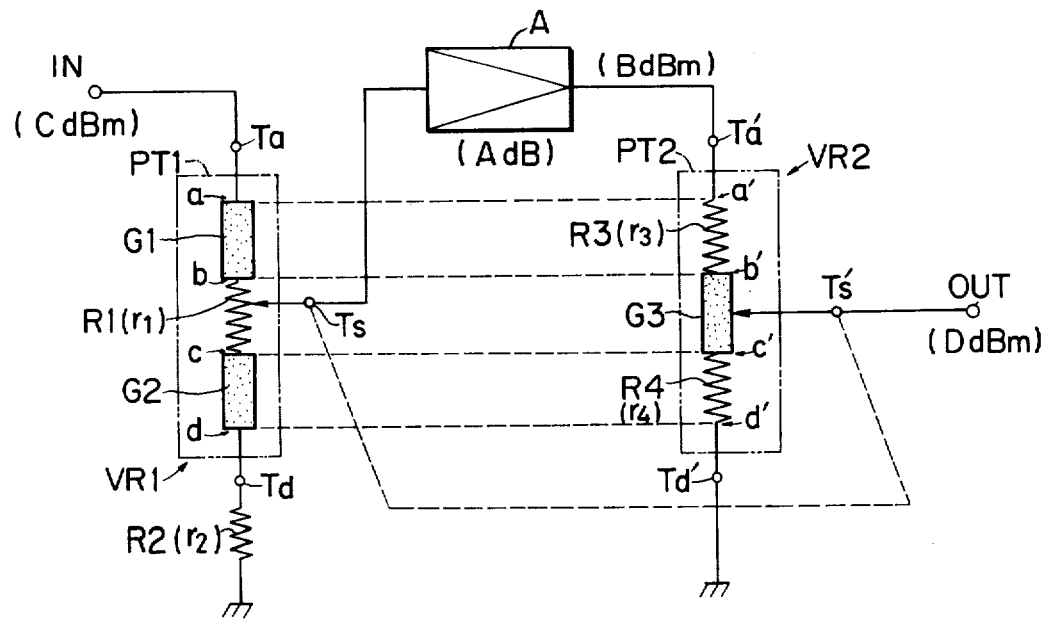
FIG. 4 is a circuit diagram showing an example of the arrangement of the amplifying system according to the present invention.

In FIG. 4 is shown a concrete example of the first and second variable attenuating means VR1 and VR2.

The first variable attenuating means VR1 comprises a first potentiometer PT1 and a resistor R2, while the second variable attenuating means VR2 comprises a second potentiometer PT2.

The first potentiometer PT1 in turn is composed of a first series connection consisting of a first and a second conductor element G1 and G2 and a resistor element R1, all of which are connected in series, a pair of fixed terminals Ta and Td connected to the respective ends of the series connection, respectively, and a slider tap Ts slidable in contact with the first series connection from one end to another end of this series connection. The one Ta of the fixed terminals Ta and Td is connected to the input terminal IN of the amplifying system, the other Td grounded via the resistor R2, and the slider tap Ts is connected to the input terminal of the amplifier A. The second potentiometer PT2 is composed of a second series connection consisting of a pair of resistor elements R3 and R4 and a conductor element G3, all of which are serially connected, a pair of fixed terminals Ta' and Td', and a slider tap Ts' which is slidable in contact with the second series connection from one end to another end of this series connection. The respective fixed terminals Ta' and Td' of the second potentiometer PT2 are connected to the output terminal of the amplifier A and to the ground, and the slider tap Ts' is connected to the output terminal OUT of the whole amplifying system.

The slider taps Ts and Ts' of both potentiometers PT1 and PT2 are mechanically interlocked to each other to be gangoperative so that: when the slider tap Ts for the first potentiometer PT1 is positioned at points $a$, $b$, $c$ and $d$ which are the junctions of the elements G1, R1 and G2, the slider tap Ts' for the second potentiometer PT2 is simultaneously positioned at points $a'$, $b'$, $c'$ and $d'$ which are the junctions of the elements R3, G3 and R4 and which correspond to points $a$, $b$, $c$ and $d$ on the first series connection of the first potentiometer PT1. In order to materialize this interlocking movement of these two potentiometers PT1 and PT2, these potentiometers PT1 and PT2 may be designed, for instance, so that the first and second series connection for the first and second potentiometers PT1 and PT2 are arranged in the circular surfaces centering around a single same rotary shaft and the slider taps Ts and Ts' of these potentiometers PT1 and PT2 are attached to this rotary shaft so as to slide on the respective series connectins with the rotation of this shaft.

In FIGS. 5 and 6 are shown the resistance-variation characteristics of the first and the second potentiometers PT1 and PT2.

Referring now to FIG. 5, the resistance of that part of the first series connection for the first potentiometer PT1 located between the slider tap Ts and point d varies in accordance with the curve L1 as the slider tap Ts is slided along the first series connection from point d to point a of the first potentiometer PT1. On the other hand, the resistance of that portion of the second series connection for the second potentiometer PT2 located between the slider tap Ts' and point $d'$ varies in accordance with the curve L2 of FIG. 6, as the slider tap Ts' is adjusted to be slided jointly with the slider tap Ts along the second series connection from point $d'$ to point $a'$ of the second potentiometer PT2. Needless to say, it can be easily understood that both variable attenuating means VR1 and VR2 may be regarded as voltage dividers including the potentiometers PT1 and PT2 whose voltage-dividing ratios, i.e. the attenuating factors of these means VR1 and VR2, can be adjusted by operating the respective slider taps Ts and Ts' simultaneously in interlocked relation.

Thus, there can be obtained such a total attenuation characteristic of both variable attenuating means VR1 and VR2 as shown by the curve L3 in FIG. 7. It should be noted that, in FIG. 7, the positions of the slider taps Ts and Ts' on the respective series connections for the first and second potentiometers VR1 and VR2 are represented by a rotation angle of a rotary shaft for moving the slider taps Ts and Ts', assuming that the potentiometers PT1 and PT2 have such a structural arrangement as has been previously described.

It is possible by the amplifying system of FIG. 4 to amplify an input signal of a level up to an allowable maximum level which is set for this system at a high S/N ratio without any distortion resulting from the saturation of the amplifier A of this system, provided that the resistance values r1, r3 and r4 of the resistor elements R1, R3 and R4 and the resistance value r2 of the resistor R2 is determined as follows. Let us now assume that the allowable maximum level of the input signal for the amplifying system is CdBm; that the available (rated) maximum output-level of the amplifying system is DdBm; that the maximum level of that output signal of the amplifier A which this amplifier A can deliver out without developing a saturation distortion of this utput signal is BdBm; and that the gain of the amplifier A is AdB. Under these conditions of the amplifying system, it is possible for this amplifying system to amplify, an input signal of a certain level not exceeding CdBm and to deliver an output of a level up to DdBn with a high S/N ratio and without developing a saturation distortion due to the saturation of the amplifier A, provided that the resistance values $r1$, $r2$, $r3$ and $r4$ are determined so that the attenuation factors by the two signal-level attenuating means VR1 and the resistar R2 is $[C-(B-A)]$ $dB$ when the slider taps Ts and Ts' of the two potentimeters PT1 and PT2 are operated simultaneously in an interlocked relation by a single same adjusting operation so as to be positioned at points c and c, respectively; and that the attenuation factor by the signal-level attenuating means $(B-D)$ dB VR2 is for the slider taps Ts and Ts' by a similar operation as above at points b and b', respectively.

It can be understood that the slider taps Ts and Ts' are positioned at a certain point, on the elements G1 and R3, respectively, in order to adjust the over-all gain to a certain gain value within said first sub-range which is described with FIG. 3; that the slider taps Ts and Ts' at a certain point on the elements R1 and G3, respectively, in order to adjust the over-all gain to a certain gain value within said second sub-range which is described with FIG. 3; and that the slider taps Ts and Ts' at a certain point on the elements G2 and R4, respectively, in order to adjust the over-all gain to a certain gain value within third sub-range which is described with FIG. 3.

As described above, according to the present invention, there can be provided an improved amplifying system whose over-all gain can be adjusted by a simple gain-adjusting operation so that the output signal of this system of a desired level is delivered at a high S/N ratio and without any distortion of the output signal resulting from the saturation of the amplifier in the system, for any level of the signal inputted to the system.

While the present invention has been disclosed in connection with a preferred embodiment thereof, it should be understood that there may be other obvious modifications to the invention which fall within the spirit and the scope of the invention as defined by the appended claims.

I claim:

1. An amplifying system having an overall gain which is adjustable for a gain-variable range which is set for this amplifying system, comprising:
   a first variable attenuating means for receiving an input signal for the amplifying system to thereby deliver out said input signal of the level attenuated by this variable attenuating means,
   an amplifier having a certain gain for amplifying the signal derived from said first variable attenuating means,
   a second variable attenuating means for receiving the output signal of said amplifier to deliver out, as an output signal of the amplifying system, said received output signal of the level attenuated by this variable attenuating means,
   said over-all gain being varied for said gain-variable range depending upon the total of the respective attenuation factors of said first and second variable attenuating means,
   said gain-variable range including at least a first sub-range covering from the maximum gain value of said gain-variable range to a first gain value which is less than said maximum gain value and a second sub-range covering from said first gain value to a second gain value which is less than said first gain value, and
   movable means ganging said first and second variable attenuating means for mutually substantially exclusively changing the respective attenuation factors of said first and second variable attenuating means so that by one movement of said ganging means said second variable attenuating means changes said over-all gain with respect mainly to said first sub-range of said gain-variable range and by another movement of said ganging means said first variable attenuating means changes said over-all gain with respect mainly to said second sub-range of said gain-variable range.

2. An amplifying system according to claim 1, in which:
   said gain-variable range further includes a third sub-range covering from said second gain value to zero,
   the attenuation factor of mainly said second variable attenuating means being varied by operation of said ganging means to change said over-all gain with respect to said third sub-range of said gain-variable range.

3. An amplifying system according to claim 2, in which:
   said first variable attenuating means comprises a first potentiometer having a first fixed terminal connected to an input terminal being applied with said input signal for the amplifying system, a second fixed terminal grounded via a resistor, and a first slider tap connected to the input terminal of said amplifier, and in which:
   said second variable attenuating means comprises a second potentiometer having a third fixed terminal connected to the output terminal of said amplifier, a fourth fixed terminal grounded, and a second slider terminal connected to an output terminal from which said output signal of the amplifying system is delivered,
   said first and second slider taps being gang-operative by said operation for adjusting the over-all gain.

4. An amplifying system according to claim 3, in which:
   said first slider tap is slidable in contact with a first series connection of said first potentiometer which connection consists of a first resistor element, and a first and second conductor elements conected together through said first resistor element interposed therebetween, in said first potentiometer, said first and second fixed terminals being connected to the respective ends of said first series connection, and in which:
   said second slider tap is slidable in contact with second series connection of said second potentiometer which connection consists of third conductor element, and a second and third resistor elements connected together through said third conductor element interposed therebetween,
   said first and second slider taps being moved by said same single adjusting gaining means to be positioned at certain corresponding points on both said first conductor element and second resistor element, respectively, with respect to said first sub-range; at certain corresponding points on both said first resistor element and said third conductor element, respectively, with respect to said second sub-range; and, at certain corresponding points on both said second conductor element and said third resistor element, respectively, with respect to said third sub-range.

5. An amplifying system according to claim 4, in which:
   said first, second and third resistor elements and said resistor having such resistance values thereof that, when said first and second slider taps are positioned at the respective junctions both of said first conductor element and said first resistor element and of said second resistor element and said third conductor element, the attenuation factor by said second variable attenuating means is $(B-D)dB$; and that, when said first and second slider taps are positioned at the respective junctions both of said first resistor element and said second conductor element and of said third conductor element and said third resistor element, respectively, the total of the respective attenuation factors by said first signal-level attenuating means is $[C-(B-A)]dB$, wherein: C represents the allowable maximum level of said input signal; D represents the rated maximum level of said output signal of the amplifying system; B represents the allowable maximum level of the output signal of said amplifier which can be delivered out by said amplifier without any distortion of this output signal resulting from the saturation of this amplifier; and A represents the gain of the amplifier.

6. An amplifying system having an over-all gain which is adjustable for a gain-variable range which is set for this amplifying system, comprising:

a first variable attenuating means for receiving an input signal for the amplifying system to thereby deliver out said input signal of the level attenuated by this variable attenuating means, an amplifier having a certain gain for amplifying the signal derived from said first variable attenuating means, a second variable attenuating means for receiving the output signal of said amplifier to deliver out, as an output signal of the amplifying system, said received output signal of the level attenuated by this variable attenuating means, said over-all gain being varied for said gain-variable range depending upon the total of the respective attenuation factors of said first and second variable attenuating means, said gain-variable range including at least a first sub-range covering from the maximum gain value of said gain-variable range to a first gain value which is less than said maximum gain value and a second sub-range covering from said first gain value to a second gain value which is less than said first gain value, and movable means ganging said first and second variable attenuating means for mutually substantially exclusively changing the respective attenuation factors of said first and second variable attenuating means as to said first and second sub-ranges.

7. An amplifying system having an over-all gain which is adjustable for a gain-variable range which is set for this amplifying system, comprising:

a first variable attenuating means for receiving an input signal for the amplifying system to thereby deliver out said input signal of the level attenuated by this variable attenuating means, an amplifier having a certain gain for amplifying the signal derived from said first variable attenuating means, and a second variable attenuating means for receiving the output signal of said amplifier to deliver out, as an output signal of the amplifying system, said received output signal of the level attenuated by this variable attenuating means, said over-all gain being varied for said gain-variable range depending upon the total of the respective attenuation factors of said first and second variable attenuating means, said gain-variable range including at least a first sub-range covering from the maximum gain value of said gain-variable range to a first gain value which is less than said maximum gain value and a second sub-range covering from said first gain value to a second gain value which is less than said first gain value, said first and second variable attenuating means having a first set of different resistive values for said first sub-range and a second set of different resistive values for said second sub-range and being ganged so that both attenuating means operate in the same sub-range at the same time.

8. An amplifying system as in claim 7 wherein:

as to said first sub-range the said resistive, value of the second variable attenuating means is far larger than the said value of the first variable attenuating means, and as to said second sub-range the said resistive value of the first variable attentuating means is far larger than the second value of said second variable attentuating means.

* * * * *